United States Patent
Sandhu et al.

[19]

[11] Patent Number: 6,066,553
[45] Date of Patent: *May 23, 2000

[54] SEMICONDUCTOR PROCESSING METHOD OF FORMING ELECTRICALLY CONDUCTIVE INTERCONNECT LINES AND INTEGRATED CIRCUITRY

[75] Inventors: Gurtej S. Sandhu; Ravi Iyer, both of Boise, Id.

[73] Assignee: Micron Technology, Inc., Boise, Id.

[*] Notice: This patent is subject to a terminal disclaimer.

[21] Appl. No.: 08/873,845

[22] Filed: Jun. 12, 1997

Related U.S. Application Data

[63] Continuation of application No. 08/552,880, Nov. 3, 1995, Pat. No. 5,665,644.

[51] Int. Cl.$^7$ .................................................. H01L 21/44
[52] U.S. Cl. ......................... 438/624; 438/641; 438/696; 438/596
[58] Field of Search .................................. 257/211, 275, 257/508, 664, 758–760, 347, 390; 438/595, 596, 622, 624, 696, 641, 618

[56] References Cited

U.S. PATENT DOCUMENTS

| 3,169,892 | 2/1965 | Lemelson | 257/758 |
|---|---|---|---|
| 3,759,798 | 9/1973 | Graff et al. | 257/760 |
| 4,625,391 | 12/1986 | Sasaki | 257/384 |

(List continued on next page.)

FOREIGN PATENT DOCUMENTS

| 000467553 | 1/1992 | European Pat. Off. | 257/763 |
|---|---|---|---|
| 0467553 | 1/1992 | European Pat. Off. | 257/763 |
| 352027387 | 3/1977 | Japan | 257/758 |
| 52-27387 | 3/1977 | Japan | H01L 23/50 |
| 358148436 | 9/1983 | Japan | 257/664 |
| 59-188143 | 10/1984 | Japan | 257/158 |
| 359213165 | 12/1984 | Japan | 257/763 |

(List continued on next page.)

OTHER PUBLICATIONS

Korczynski, E.J. et al., "Improved Sub–Micron Inter–Metal Dielectric Gap–Filling Using TEOS/Ozone APCVD", Microelectronics Manufacturing Technology, Jan. 1992, pp. 22–27.

Thomas Michael E. et al., "VLSI Multilevel Micro–Coaxial Interconnects For High Speed Devices", IEEE, 1990, pp. 55–58.

Fujino, K., Silicon Dioxide Deposition By Atmospheric Pressure And Low–Temperature CVD Using TEOS and Ozone, J. Electrochem. Soc., vol. 137, No. 9, Sep. 1990, pp. 2884–2887.

*Primary Examiner*—Chandra Chaudhari
*Assistant Examiner*—Thanh Nguyen
*Attorney, Agent, or Firm*—Wells, St. John, Roberts, Gregory & Matkin, P.S.

[57] ABSTRACT

A semiconductor processing method of forming an electrically conductive interconnect line having an electrical conductive covering predominately coextensive therewith, includes, a) providing an conductive interconnect line over a first electrically insulating material, the line having a top and sidewalls; b) selectively depositing a second electrically insulating material layer over the interconnect line and the first insulating material in a manner which deposits a greater thickness of the second insulating material atop the interconnect line than a thickness of the second insulating material over the first insulating material; c) anisotropically etching the second insulating material layer inwardly to at least the first insulating material yet leaving second insulating material over the top and the sidewalls of the interconnect line; and d) providing an electrically conductive layer over the anisotropically etched second insulating layer to form a conductive layer which is predominately coextensive with the interconnect line over the etched second insulating material. The method further comprises provision of a base electrically conductive layer beneath the first insulating material, with the anisotropically etching step etching through the first insulating material to the base conductive layer, and the conductive layer being provided in electrical connection with the base conductive layer. Integrated circuitry produced by the method and other methods is also disclosed.

13 Claims, 4 Drawing Sheets

U.S. PATENT DOCUMENTS

| | | | |
|---|---|---|---|
| 4,854,351 | 8/1989 | Batty | 437/195 |
| 4,872,947 | 10/1989 | Wang et al. | 156/643 |
| 4,877,443 | 10/1989 | Bergemont et al. | 437/191 |
| 4,892,753 | 1/1990 | Wang et al. | 427/38 |
| 4,892,844 | 1/1990 | Cheung et al. | 437/194 |
| 4,894,351 | 1/1990 | Batty | 437/190 |
| 4,997,790 | 3/1991 | Woo et al. | 438/595 |
| 5,027,176 | 6/1991 | Saika et al. | 257/758 |
| 5,126,283 | 6/1992 | Pintchovski et al. | 257/758 |
| 5,271,972 | 12/1993 | Kwok et al. | 427/579 |
| 5,319,158 | 6/1994 | Lee et al. | |
| 5,357,138 | 10/1994 | Kobayashi | |
| 5,378,646 | 1/1995 | Huang et al. | 437/195 |
| 5,429,969 | 7/1995 | Chang | 438/596 |
| 5,432,128 | 7/1995 | Tsu | 438/635 |
| 5,436,504 | 7/1995 | Chakravorty et al. | 257/758 |
| 5,473,184 | 12/1995 | Murai | 437/203 |
| 5,497,019 | 3/1996 | Mayer et al. | 257/347 |
| 5,498,571 | 3/1996 | Mori et al. | 437/195 |
| 5,508,233 | 4/1996 | Yost et al. | 437/195 |
| 5,510,640 | 4/1996 | Shindo | 257/347 |
| 5,536,681 | 7/1996 | Jang et al. | 437/195 |
| 5,539,256 | 7/1996 | Mikagi | 257/753 |
| 5,592,024 | 1/1997 | Aoyama et al. | 257/760 |
| 5,614,439 | 3/1997 | Murooka et al. | |
| 5,665,643 | 9/1997 | Shin | 438/763 |
| 5,696,386 | 12/1997 | Yamazaki | 257/347 |

FOREIGN PATENT DOCUMENTS

| | | | |
|---|---|---|---|
| 360015947 | 1/1985 | Japan | 257/758 |
| 60-15947 | 1/1985 | Japan | 257/158 |
| 60-178641 | 9/1985 | Japan | 257/158 |
| 63-90842 | 4/1988 | Japan | 257/158 |
| 3-78251 | 4/1991 | Japan | |
| 3-286568 | 12/1991 | Japan | |
| 6-97300 | 4/1994 | Japan | 257/158 |

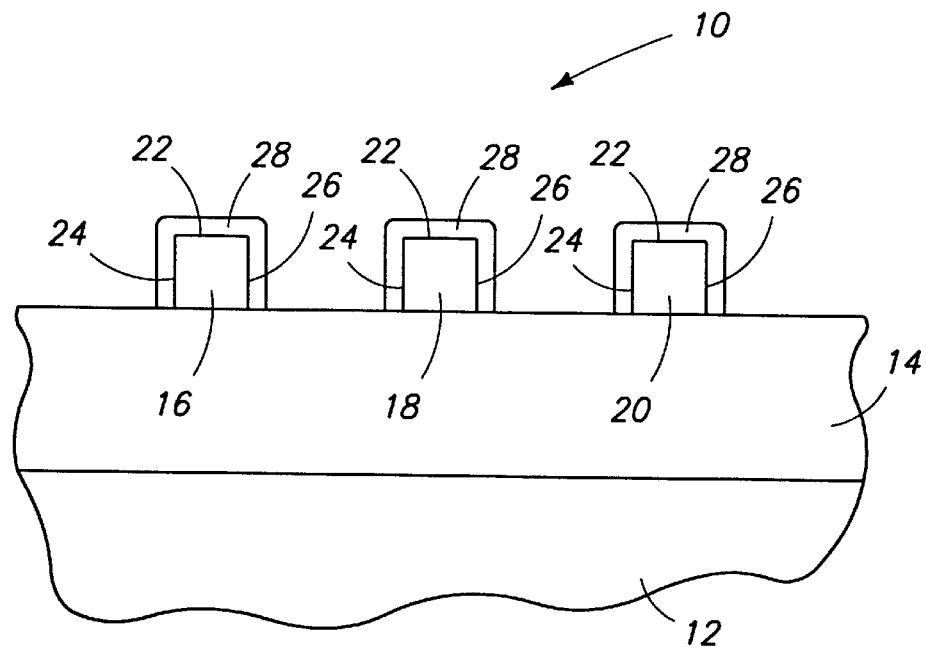
_FIG. 3_
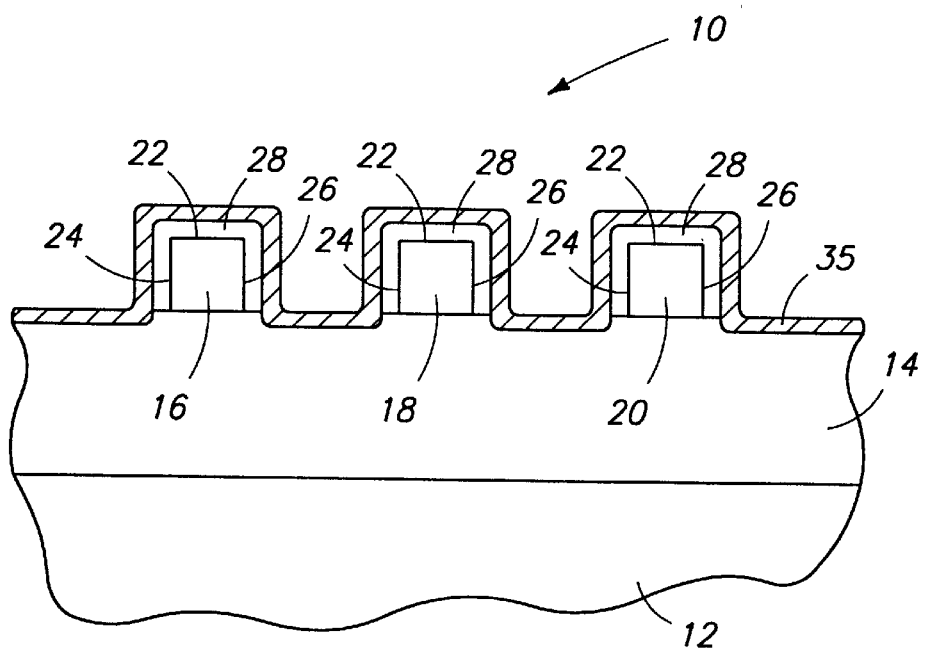
_FIG. 4_

6,066,553

SEMICONDUCTOR PROCESSING METHOD OF FORMING ELECTRICALLY CONDUCTIVE INTERCONNECT LINES AND INTEGRATED CIRCUITRY

RELATED PATENT DATA

This patent resulted from a continuation application of U.S. patent application Ser. No. 08/552,880, filed Nov. 3, 1995, now U.S. Pat. No. 5,665,644, titled "Semiconductor Processing Method Of Forming Electrically Conductive Interconnect lines And integrated Circuitry", and listing the inventors as Gurtej S. Sandhu and Ravi Iyer.

TECHNICAL FIELD

This invention relates to semiconductor processing methods of forming an electrically conductive interconnect line having an electrical conductive covering predominately coextensive therewith.

BACKGROUND OF THE INVENTION

The high speed operation of future higher density integrated circuits will be dictated by interconnect response. Realization of such high speed circuitry is impacted by cross-talk between different adjacent interconnect lines. Cross-talk imposes the biggest constraint on high speed operation when frequencies exceed 500MHz. Lowering the metal conductor resistivity or the dielectric constant of insulators interposed between metal lines is not expected to inherently solve the cross-talk problem. In addition, the gain in system response is only enhanced by a factor of 3, at best, when these changes are ideally integrated into manufacturing processes.

One proposed method for eliminating cross-talk is in the provision of co-axial interconnect lines, such as described in Thomas et al., VLSI "Multilevel Micro-Co-Axial Interconnects for High Speed Devices", IEDM 90–55, pp. 3.5.1–3.5.4 (1990). Such technique shields each conductive line in an outer co-axial layer which is then connected to ground or some other suitable potential to overcome or shield cross-talk between adjacent lines.

This disclosure comprises an improvement to such co-axial interconnect lines and methods of forming such.

BRIEF DESCRIPTION OF THE DRAWINGS

Preferred embodiments of the invention are described below with reference to the following accompanying drawings.

FIG. 3 is a view of the FIG. 1 wafer fragment at a processing step subsequent to that shown by FIG. 2.

FIG. 4 is a view of the FIG. 1 wafer fragment at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming an electrically conductive interconnect line having an electrical conductive covering predominately coextensive therewith comprises the following steps:

providing an conductive interconnect line over a first electrically insulating material, the line having a top and sidewalls;

selectively depositing a second electrically insulating material layer over the interconnect line and the first insulating material in a manner which deposits a greater thickness of the second insulating material atop the interconnect line than a thickness of the second insulating material over the first insulating material;

anisotropically etching the second insulating material layer inwardly to at least the first insulating material yet leaving second insulating material over the top and the sidewalls of the interconnect line; and providing an electrically conductive layer over the anisotropically etched second insulating layer to form a conductive layer which is predominately coextensive with the interconnect line over the etched second insulating material.

In accordance with another aspect of the invention, integrated circuitry comprises:

an electrically insulative substrate;

an electrically conductive interconnect line provided over the electrically insulative substrate, the interconnect line having a top and sidewalls;

an electrically insulative material over the interconnect line top and sidewalls and operatively connecting with the insulative substrate in an electrically insulative manner; and an electrically conductive layer provided over the insulative material and over the insulative substrate, the electrically conductive layer being predominately coextensive with the interconnect line.

Figure 1:
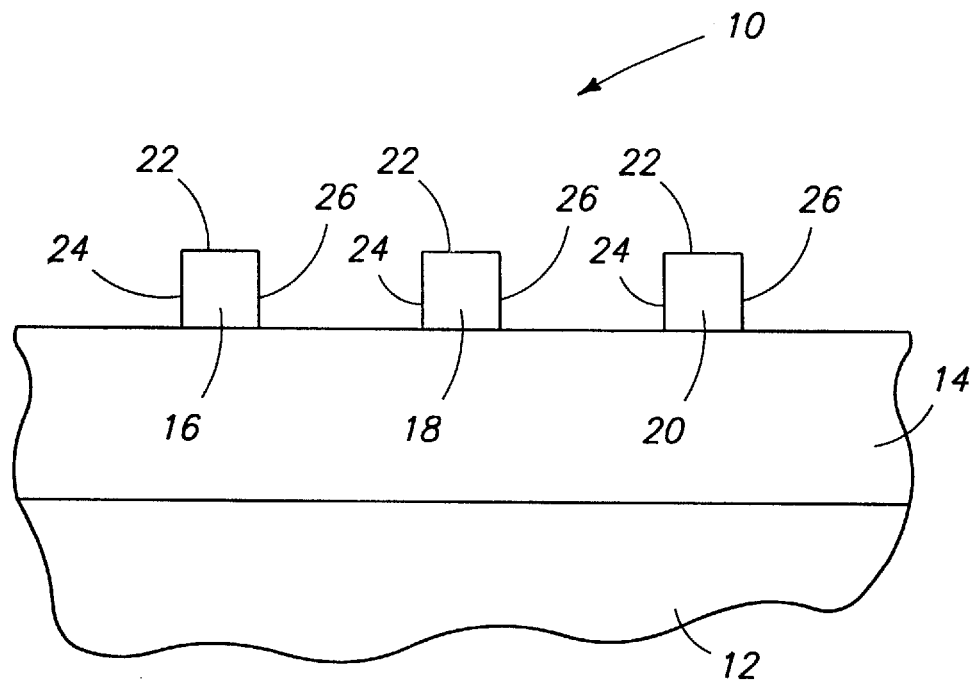
FIG. 1 is a diagrammatic sectional view of a semiconductor wafer fragment at one processing step in accordance with the invention.

Referring to FIG. 1, a semiconductor wafer fragment in process is indicated generally with reference numeral 10. Such comprises a bulk substrate 12 and an overlying first electrically insulating material 14. Bulk substrate 12 typically comprises monocrystalline silicon. Insulating material layer 14 preferably comprises $SiO_2$, and may be doped with example dopants of phosphorus and/or boron. Alternately, layer 14 could be intrinsically pure as-deposited by any of a number of techniques, including but not limited to decomposition of tetraethylorthosilicate utilizing molecular oxygen, $O_3$ or other gases. An example thickness for layer 14 is 5000 Angstroms. At least two spaced electrically conductive interconnect lines, with three lines 16, 18 and 20 being shown, are provided over first electrically insulating material 14. Preferably, interconnect lines 16, 18 and 20 predominately comprise metal. In the context of this document, "metal" is intended to encompass elemental metal, metal alloys, or metal compounds having electrical conductivity conventionally associated with metallic materials. Interconnect lines 16, 18 and 20 have a respective top 22 and opposing respective sidewalls 24 and 26.

Figure 2:
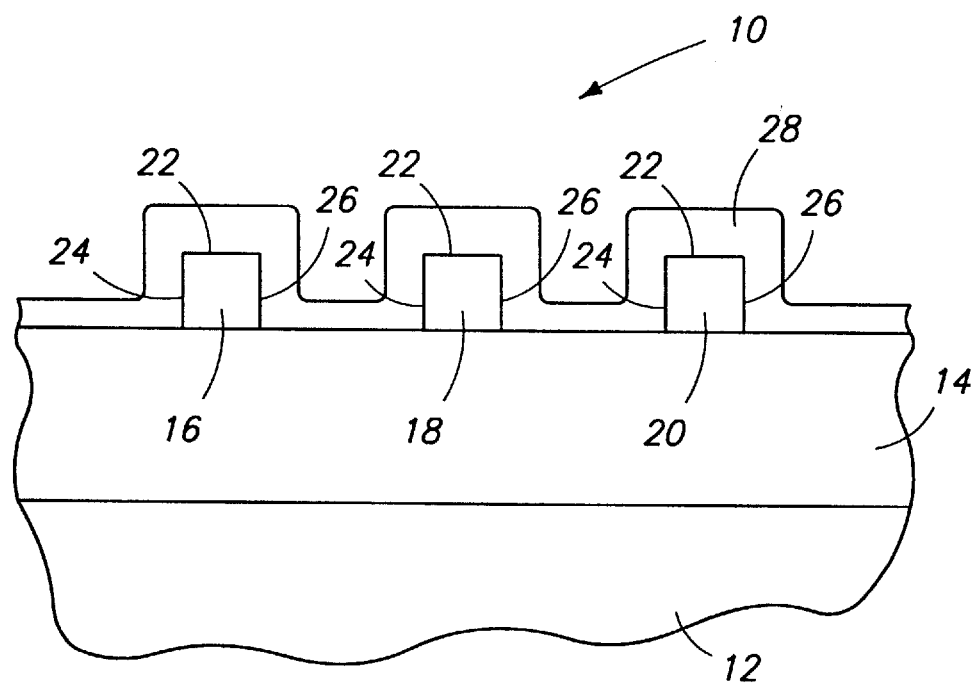
FIG. 2 is a view of the FIG. 1 wafer fragment at a processing step subsequent to that shown by FIG. 1.

Referring to FIG. 2, a second electrically insulating material layer 28 is selectively deposited over interconnect lines 16, 18 and 20 in a manner which deposits a greater thickness of the second insulating material atop the interconnect lines than a thickness of the second insulating material over first insulating material 14 between the lines. so A preferred material for layer 28 comprises $SiO_2$ which can include dopants if desired. Alternate materials are also contemplated in accordance with the invention, such as $Al_2O_3$ or $Si_3N_4$. The insulating materials of layers 28 and 14 can constitute the same materials, or different materials. The preferred process for providing layer 28 where it predominately comprises $SiO_2$ is by decomposition of tetraethylorthosilicate (TEOS) using ozone gas. An example process is, pressure from 10 Torr to 600 Torr, temperature from 200° C. to 500° C., $O_3$ concentration in $O_2$ from 2:1 to 20:1, ozone to TEOS ratio from 0.5:1 to 200:1, He flow into TEOS bubbler from 200 to 5000 sccm, TEOS bubbler temperature from 20° C. to 60° C., and with TEOS flow from 200 sccm to 4000 sccm.

The following is a list of $SiO_2$ thicknesses which were deposited on different portions of a wafer having the indicated outer substrate surface using the above method. Such occurred from deposition for 300 seconds at 400 degrees C and 450 Torr pressure.

| Substrate | Oxide thickness (A) |
| --- | --- |
| Oxide | 6050 |
| Si | 7065 |
| Al | 7944 |
| TiN | 9622 |
| W | 7964 |

Accordingly, $SiO_2$ deposited by the above ozone TEOS decomposition method provides an approximate 60% thickness increase on TiN as compared to deposition on $SiO_2$, and an approximate 30% increase with respect to aluminum.

Referring to FIG. 3, second insulating material layer 28 is anisotropically etched inwardly to at least first insulating material 14, yet leaving second insulating material 28 over tops 22 and sidewalls 24 and 26 of electrically conductive interconnect lines 16, 18 and 20. Example etching conditions where layer 28 consists essentially of $SiO_2$ deposited by decomposition of TEOS using ozone are $CF_4$ flow at 15 sccm, $CHF_3$ flow at 25 sccm, for 30 seconds at 200 mTorr and a power of 1000 Watts. Example thickness for layer 28 as-deposited above top surfaces 22 of interconnect lines 16, 18 and 20 is 5000 Angstroms, with an example thickness of layer 28 as-deposited over insulating material 14 therebetween being 3000 Angstroms. An example spacing for the adjacent interconnect lines is 8000 Angstroms.

The above example anisotropic etch would typically and preferably be conducted as a timed etch to assure substantial complete removal of the thinnest portions of layer 28, yet leave adequate remaining material 28 over tops 22 and sidewalls 24 and 26 of the interconnect lines. Where layers 14 and 28 constitute different electrically insulative materials, anisotropic etching of layer 28 might be conducted to selectively stop relative to layer 14. Alternately and preferably, it is desirable to conduct the anisotropic etching such that etching would inherently occur into first insulating material layer 14, as would most probably occur if layers 28 and 14 constituted the same or very similar material. Such over-etching will reduce fringe field effects between lines in the resulting circuitry.

Preferably, the anisotropic etching is conducted without using any separate masking layer over the conductive lines in the vicinity or area where etching occurs. This is understood to be contrary to the method or process disclosed in the Thompson et al. article referred to in the "Background" section above. Accordingly, a substantially encapsulating dielectric layer 28 is provided about conductive interconnect lines 16, 18 and 20.

Referring to FIG. 4, an electrically conductive layer 35 is provided over anisotropically etched second insulating layer 28 to form a common conductive layer which is predominately coextensive, and effectively co-axial, with lines 16, 18 and 20 over etched second insulating material 28. Such common layer 35 is coextensive in that it preferably runs continuously along the substantial or predominate lengths of lines 16, 18 and 20. In the preferred embodiment, such thereby effective forms a series of co-axial lines. Common layer 35 preferably constitutes a metal, such as the same metal material from which lines 16, 18 and 20 are fabricated. Layer 35 can be patterned as desired, and would typically be connected to ground or other suitable potential for providing a desired coextensive shielding effect from cross-talk among adjacent or other neighboring conductive lines.

Thus, an example process is provided which in the most preferred embodiment does not fundamentally require patterning with respect to the electrically insulative material which encapsulates individual interconnect lines. Further, such has been described with respect to formation of at least two adjacent interconnect lines. Alternately, the process has utility in the formation of a single, electrically shielded interconnect line. Also, the preferred described embodiment has been with respect to shielding between horizontally adjacent interconnect lines. Aspects of the invention would of course be applicable to vertically, diagonally or other spaced lines, with the invention only being limited by the accompanying claims appropriately interpreted in accordance with the doctrine of equivalents.

Figure 5:
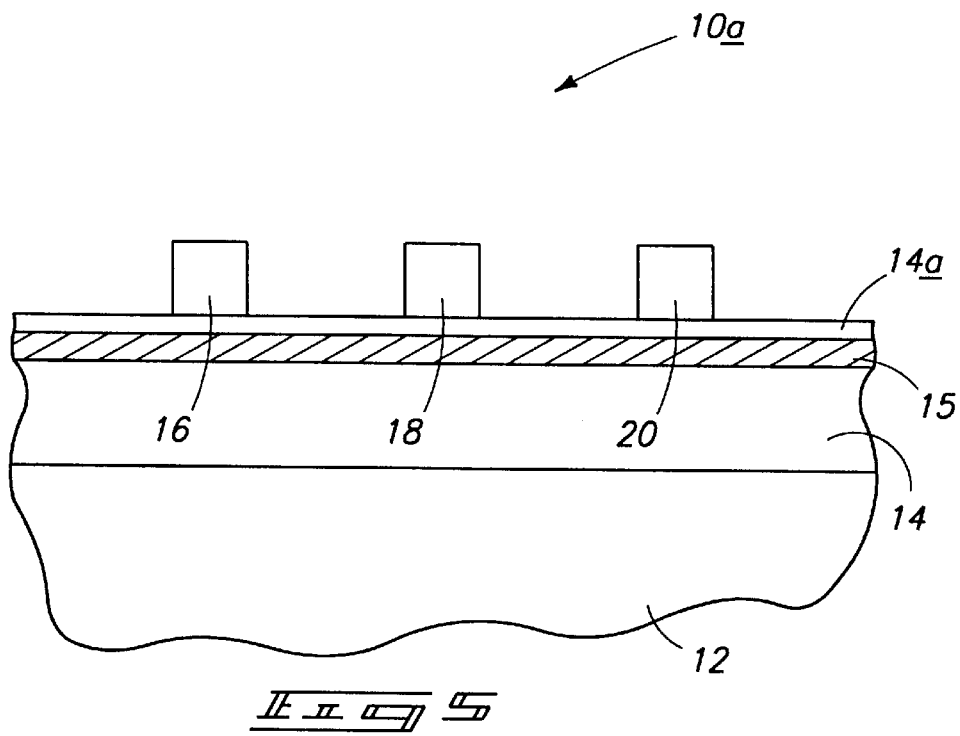
FIG. 5 is a diagrammatic sectional view of an alternate embodiment semiconductor wafer fragment at a processing step in accordance with the invention.

An alternate embodiment is described with reference to FIGS. 5–8. Like numerals from the first described embodiment are utilized where appropriate, with differences being indicated by the suffix "a", or with different numerals. Referring first to FIG. 5, wafer fragment 10a includes a base electrically conductive layer 15 beneath first insulating material layer 14a. An example and preferred material for layer 15 is metal, such as the same metal as the conductive lines and overlying common layer of the previous described embodiment. An example preferred thickness in this described embodiment for layer 14a is 1000 Angstroms, with an example preferred thickness for layer 15 being 5000 Angstroms.

Figure 6:
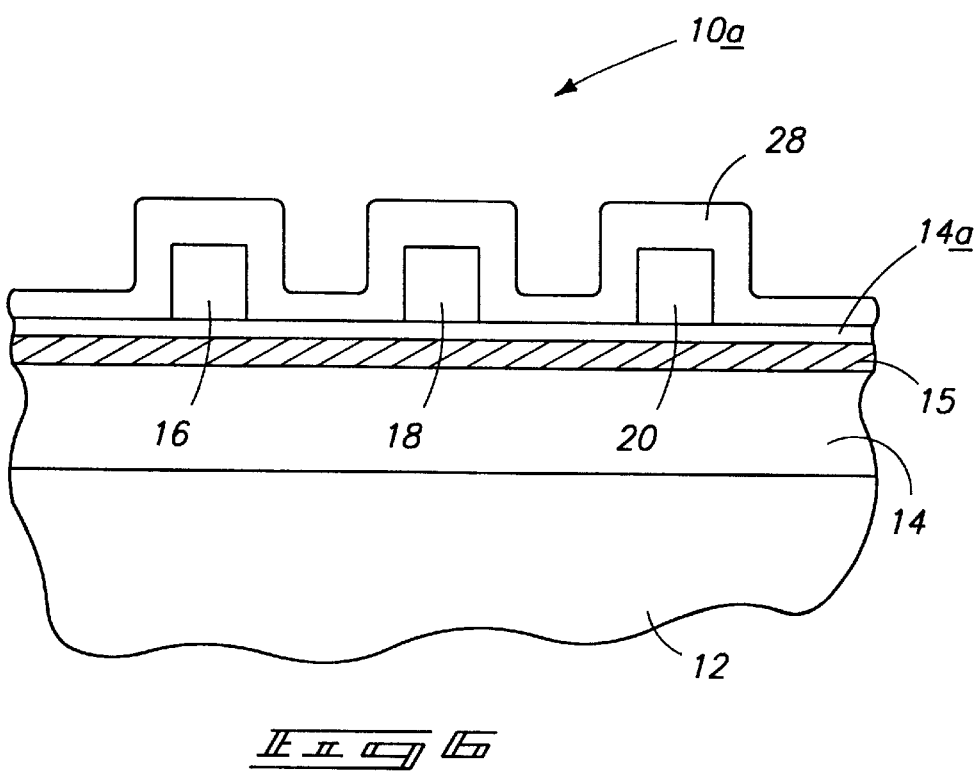
FIG. 6 is a view of the FIG. 5 wafer fragment at a processing step subsequent to that shown by FIG. 5.

Referring to FIG. 6, insulating layer 28 is deposited, with an example thickness of layer 28 above tops 22 being 5000 Angstroms and a thickness of layer 28 over insulating material 14a between the conductive interconnects being 3000 Angstroms.

Figure 7:
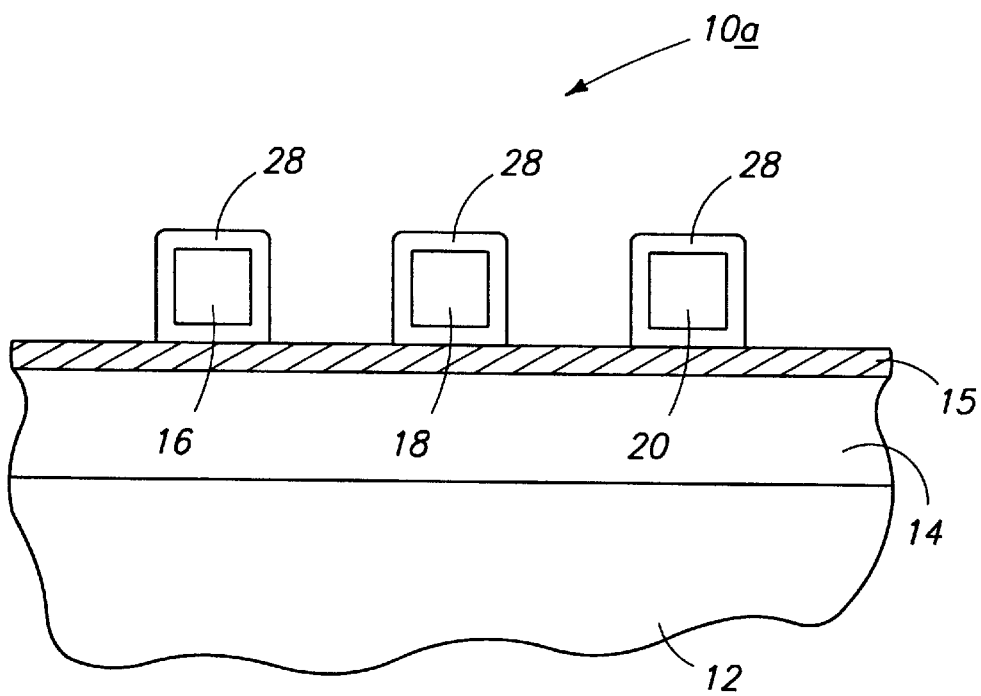
FIG. 7 is a view of the FIG. 5 wafer fragment at a processing step subsequent to that shown by FIG. 6.

Referring to FIG. 7, layer 28 is anisotropically etched through first insulating material layer 14a to base conductive layer 15. Accordingly, with the above described example, this will leave an approximate 1000 Angstrom thick layer of insulating material beneath conductive lines 16, 18 and 20 intermediate base conductive layer 15, and a 1000 Angstrom thick layer above tops 22 of interconnect lines 16, 18 18 and 20. The thickness of layer 28 over sidewalls 24 and 26 at this point in the process will typically be approximately 1000 Angstroms to 3000 Angstroms.

Figure 8:
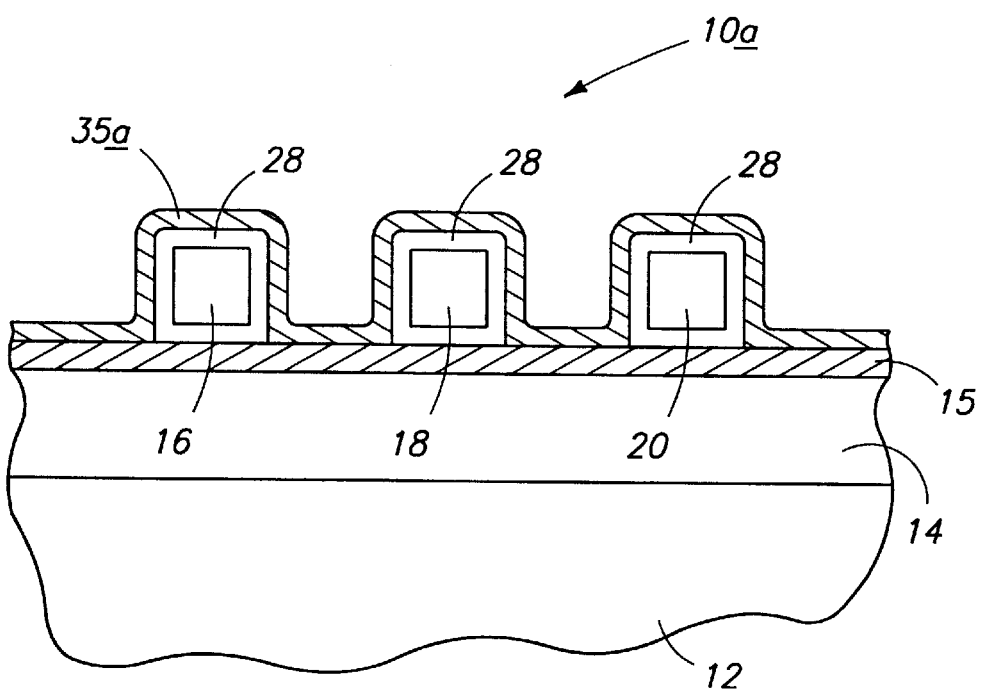
FIG. 8 is a view of the FIG. 5 wafer fragment at a processing step subsequent to that shown by FIG. 7.

Referring to FIG. 8, common conductive layer 35a is provided over anisotropically etched second insulating layer 28. Common conductive layer 35a is thereby provided in electrical connection with base conductive layer 15.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of forming a pair of electrically conductive lines each having a respective electrical conductive covering predominately coextensive therewith, the method comprising the following steps:

provide at least two spaced electrically conductive lines over a first electrically insulating material, the lines having respective tops and sidewalls;

selectively depositing a second electrically insulating material layer over the two lines and the first insulating material in a manner which deposits a greater thickness of the second insulating material atop the two lines than a thickness of the second insulating material over the first insulating material;

removing the second insulating material layer from over the first insulating material and yet leaving second insulating material over the tops and the sidewalls of the two conductive lines; and providing an electrically conductive layer over the second insulating layer to form a common conductive layer which is predominately coextensive with the two lines over the etched second insulating material.

2. The semiconductor processing method of claim 1 wherein the first and second insulating materials are the same.

3. The semiconductor processing method of claim 1 wherein the first and second insulating materials constitute different materials.

4. The semiconductor processing method of claim 1 wherein the two interconnect lines are metal.

5. The semiconductor processing method of claim 1 wherein the second insulating layer comprises $SiO_2$ deposited over the two interconnect lines by decomposition of TEOS using ozone gas.

6. A semiconductor processing method of forming an electrically conductive line having an electrical conductive covering predominately coextensive therewith, the method comprising the following steps:

providing a conductive line over a first electrically insulating material, the line having a top and sidewalls;

selectively depositing a second electrically insulating material layer over the line and the first insulating material in a manner which deposits a greater thickness of the second insulating material atop the line than a thickness of the second insulating material over the first insulating material;

removing the second insulating material layer from over the first insulating material and yet leaving second insulating material over the top and the sidewalls of the line; and providing an electrically conductive layer over the second material insulating layer to form a conductive layer which is predominately coextensive with the line over the etched second insulating material.

7. The semiconductor processing method of claim 6 wherein the first and second insulating materials are the same.

8. The semiconductor processing method of claim 6 wherein the first and second insulating materials constitute different materials.

9. The semiconductor processing method of claim 6 wherein the two interconnect lines are metal.

10. The semiconductor processing method of claim 6 wherein the second insulating layer comprises $SiO_2$ deposited over the two interconnect lines by decomposition of TEOS using ozone gas.

11. A semiconductor processing method of insulating about an electrically conductive line comprising the following steps:

forming a conductive line over a first electrically insulating material, the line having a top and sidewalls;

forming a second electrically insulating material layer over the line and the first insulating material, the second electrically insulating material layer having a first thickness atop the line and a second thickness over the first insulating material, the first thickness being greater than the second thickness;

removing the second insulating material layer from over the first insulating material and yet leaving the second insulating material layer over the top and the sidewalls of the line; and forming an electrically conductive layer over the second insulating layer.

12. A semiconductor processing method of insulating about a pair of electrically conductive lines comprising the following steps:

forming at least two spaced electrically conductive lines over a first electrically insulating material, the lines having respective tops and sidewalls and defining a region of the first insulating material between them;

forming a second electrically insulating material layer over the two lines and over the region of the first insulating material between the lines, the second electrically insulating material layer having a first thickness atop the two lines and a second thickness over the region of the first insulating material between the lines, the first thickness being greater than the second thickness;

removing the second insulating material layer from over the region of the first insulating material between the lines and yet leaving the second insulating material layer over the tops and the sidewalls of the lines; and forming an electrically conductive layer over the second insulating layer.

13. A semiconductor processing method of insulating about a pair of electrically conductive lines comprising the following steps:

forming at least two spaced metal lines over an electrically insulating material, the metal lines having respective tops and sidewalls;

forming an $SiO_2$-comprising layer over the two metal lines and the first insulating material, the $SiO_2$-comprising layer having a first thickness over the two metal lines and a second thickness over the first insulating material, the first thickness being greater than the second thickness;

removing the SiO2 layer from over the insulating material and yet leaving the $SiO_2$ layer over the tops and the sidewalls of the two metal lines; and forming an electrically conductive layer over the $SiO_2$ layer.

* * * * *

UNITED STATES PATENT AND TRADEMARK OFFICE
CERTIFICATE OF CORRECTION

PATENT NO. : 6,066,553
DATED : May 23, 2000
INVENTOR(S) : Gurtej. S. Sandhu et al.

It is certified that error appears in the above-identified patent and that said Letters Patent is hereby corrected as shown below:

Column 3,
Line 5, delete "so".

Column 4,
Line 58, delete the second occurrence of "18".

Signed and Sealed this

Seventh Day of May, 2002

Attest:

JAMES E. ROGAN
*Attesting Officer*     *Director of the United States Patent and Trademark Office*